(12) United States Patent
Aikawa et al.

(10) Patent No.: US 6,717,481 B2
(45) Date of Patent: Apr. 6, 2004

(54) INJECTION-LOCKED HIGH-FREQUENCY OSCILLATOR

(75) Inventors: Masayoshi Aikawa, Saga (JP); Fumio Asamura, Saitama (JP); Takeo Oita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/274,219

(22) Filed: Oct. 18, 2002

(65) Prior Publication Data
US 2003/0076178 A1 Apr. 24, 2003

(30) Foreign Application Priority Data

Oct. 19, 2001 (JP) ........................................ 2001-322739

(51) Int. Cl.[7] .............................. H03B 5/00; H03B 5/20
(52) U.S. Cl. ........................................ 331/135; 331/172
(58) Field of Search ........................... 331/57, 96, 101, 331/135, 136, 172

(56) References Cited

U.S. PATENT DOCUMENTS 5,109,203 A * 4/1992 Zucker et al. ............... 331/96

* cited by examiner

Primary Examiner—David Mis
(74) Attorney, Agent, or Firm—Katten Muchin Zavis Rosenman

(57) ABSTRACT

An injection-locked high-frequency oscillator has an annular transmission line, and m (m>1) units of oscillating amplifiers, and is provided with an oscillation closed loop formed with the transmission line and the oscillating amplifiers, the oscillating frequency thereof being determined by an electric length of line of the oscillation closed loop. When $n \geq 1$ is defined, and when the wavelength corresponding to the oscillating frequency is defined as $\lambda$, the electric line length from any one oscillating amplifier to the neighboring oscillating amplifier is set to be $n\lambda$ by taking delay time due to the oscillating amplifiers into consideration, and further into in-phase points on the oscillation closed loop, synchronizing signals having, respectively, a frequency that is 1/mn of the oscillating frequency are injected.

16 Claims, 6 Drawing Sheets

INJECTION-LOCKED HIGH-FREQUENCY OSCILLATOR

BACKGROUND OF THE INVENTION

1. Field of the Invention

The present invention relates to a high-frequency oscillator, and more particularly, relates to an injection-locked high-frequency oscillator, which is increased in its stability of oscillating frequency.

2. Description of the Related Art

A high-frequency oscillator having oscillating frequency of approximately 1 to 100 GHz has been mostly used as an oscillating source of a radio communication device, an optical cable transmission device or a measuring apparatus. Oscillating type of the high-frequency oscillator can be categorized into several different types, one of which is that of a so-called ring oscillator, in which an oscillation closed loop is formed by connecting a plurality of oscillating amplifiers in a transmission line of a high-frequency.

FIG. 1 is schematic view illustrating this type of conventional high-frequency oscillator.

This high-frequency oscillator is provided with transmission line 1 for high frequency signals, and first to third amplifiers 2a to 2c for oscillation. Transmission line 1 has a microstrip line structure in, for example, an unbalanced mode, and comprises a annular signal line provided on one principal plane of substrate 1 formed of, for example, a dielectric material, and a grounded conductor (not shown) provided on a substantially entire surface of the other principal plane of substrate 1. Through transmission line 1, an electric field generating between signal line 4 and the grounded conductor and the accompanying magnetic field transmit high frequency waves, i.e., electromagnetic waves, and resultantly a high-frequency electric current flows through signal line 4.

First to third oscillating amplifiers 2a to 2c are inserted in transmission line 1 so that respective of them have input terminals, respectively, directed in an identical direction to annular signal line 4 in one of the principal planes of substrate 3. Namely, signal line 4 is cut at three positions, and the input and output terminals of each of the oscillating amplifiers are respectively connected to opposite ends of each of the cut positions. Thus, signal line 4 (i.e., transmission line 1) and first to third oscillating amplifiers 2a to 2c form the oscillation closed loop.

Upon viewing from an arbitrary point of the oscillation closed loop, the oscillating frequency $f_0$ of the described high-frequency oscillator becomes a frequency that is a positive feedback containing a delay amount (time delay) of oscillating amplifiers 2a to 2c, namely, the feedback with an identical phase, and corresponds to wavelength $\lambda$. In conclusion, oscillating frequency $f_0$ is basically determined by the electric length of a line, containing the delay time of the oscillating amplifiers. In other words, the length of transmission line forming the oscillation closed loop is set at a length that becomes a positive feedback with a desired oscillating frequency with consideration of delay amounts of oscillating amplifiers 2a to 2c. The amplification degree of respective oscillating amplifiers 2a to 2c must be 1 or more at the oscillating frequency, containing a transmission loss. At this stage, the output of the oscillating frequency is derived from any one of the oscillating amplifiers, for example, oscillating amplifier 2a by the microstrip line.

Nevertheless, in the high-frequency oscillator of the above-described constitution, since the oscillating frequency is almost determined by the electric length of transmission line 1, such problems have been encountered that the Q factor (degree of acuteness of resonance) of the oscillator is small, and the frequency stability is low. Therefore, it has been tried that a synchronizing signal from high stability signal source 5 such as a quartz-crystal oscillator, is injected to, for example, the input side of oscillating amplifier 2b. Here, the frequency of the synchronizing signal is set at a value of one third of the frequency $f_0$ of the oscillator, i.e. $f_0/3$. As a result, as shown in FIGS. 2A and 2B, assuming that the wavelength corresponding to the oscillating frequency $f_0$ is $\lambda$, the phase at every $3\lambda$ is urged to be equalized by the synchronizing signal, so that the stability of the oscillating frequency of the high-frequency oscillator is increased. This type of high-frequency oscillator is called as an injection-locked high-frequency oscillator. It should be noted that FIG. 2A illustrates the waveform distribution of a component of the oscillating frequency $f_0$ along transmission line 1, and FIG. 2 illustrates the waveform distribution of the synchronizing signal $f_0/3$ along transmission line 1.

Nevertheless, in the case of the injection-locked high-frequency oscillator, since the frequency of the synchronizing signal from signal source 5 such as the crystal oscillator cannot be more than the upper limit of 500 to 600 Hz in the present state of affairs even if an overtone oscillation or a multiplying circuit is employed. Thus, the higher is the oscillating frequency $f_0$ (in GHz band) of a high-frequency oscillator, the longer the interval of injection locking of this high-frequency oscillator becomes. Accordingly, there occurs a problem such that the phase of the high frequency cannot be equalized within the interval of the injection locking while causing jitter or fluctuation thereof, to result in reduction in the stability of the oscillating frequency.

SUMMARY OF THE INVENTION

An object of the present invention is to provide an injection-locked high-frequency oscillator, capable of equalizing the phases of oscillating frequency components thereby increasing the stability of its oscillating frequency.

The object of the present invention can be achieved by an injection-locked high-frequency oscillator in which an oscillating frequency thereof is determined by an electric line length of an oscillation closed loop, the high-frequency oscillator comprising, an annular transmission line, m units of oscillating amplifiers disposed in the transmission line, m being defined as an integer larger than 1, and means for injecting synchronizing signals each having a frequency of 1/mn of the oscillating frequency into in-phase points in the oscillating closed loop, n being defined as a natural number, wherein the transmission line and the oscillating amplifiers form the oscillation closed loop, and wherein when a wavelength corresponding to the oscillating frequency is defined as $\lambda$, an electric line length from any one of the oscillating amplifiers to the neighboring oscillating amplifier is set as $n\lambda$ by taking into consideration a delay time due to the oscillating amplifiers.

In the present invention, the m units of oscillating amplifiers are disposed in the annular transmission line to form the oscillation closed loop, and the electric line length from any one of the oscillating amplifiers containing the equivalent electric line length of the one oscillating amplifier to the neighboring oscillating amplifier is set as $n\lambda$. Further, in the oscillation closed loop, the synchronizing signals of 1/mn of the oscillating frequency $f_0$ are injected into the in-phase points. As a result, the phases of the oscillating frequency $f_0$ are equalized to thereby increase the stability of the oscillating frequency. The in-phase points are typically disposed between every two neighboring oscillating amplifiers.

A further detailed description of the injection-locked high-frequency oscillator of the present invention will be provided below. In this description, the frequency of the synchronizing signal is defined as $f_s$, and the number of multiplication of the synchronizing signal $f_s$ against the oscillating frequency $f_0$ is defined as being $\alpha$. Namely, the equation $\alpha = mn = f_0/f_s$ is established.

When $n=1$, $\alpha=m$. In this case, the intervals between the respective injection points of the synchronizing signals in the transmission line become one wavelength ($\lambda$) of oscillating frequency $f_0$. Further, at the respective injection points of the synchronizing signals, i.e., the in-phase points of the oscillating frequency, "m" numbers of peaks of the waveform of oscillating frequency $f_0$ pass during one cycle ($m/f_0$) of the synchronizing signals. More specifically, the waveform corresponding to the length of $m\lambda$ passes. Therefore, at the respective injection points, a component of oscillating frequency $f_0$ is drawn into the synchronizing signals at every $m\lambda$ to equalize the phases.

When the injection points of the synchronizing signals at "m" positions in the transmission line are equidistantly disposed, namely when the substantial electric lengths of the transmission line including the oscillating amplifiers are identical to one another among respective neighboring injection points, the synchronizing signals are injected into the oscillating frequency at every injection point in such a manner that respective phases are shifted from one another by an amount of $\lambda$ (=$2\pi$). Therefore, during one circulation of a high frequency signal around the oscillation closed loop, the phases are equalized by the synchronizing signals at every wavelength $\lambda$ of the oscillating frequency.

Although the above description was provided under such a condition that n=1, and the number m of the oscillating amplifiers is equal to the number $\alpha$ of multiplication, if the number $\alpha$ of multiplication is 2m, the phases of the oscillating frequency will be equalized at every $2\lambda$ under the above-described condition. Further, in the case where the intervals between every neighboring injection points where the injection of the synchronizing signal is respectively conducted are determined so as to correspond to two wavelengths of the oscillating frequency, equalizing of the phase will be conducted at every $2\lambda$ of the oscillating frequency.

DETAILED DESCRIPTION OF THE INVENTION

Figure 1:
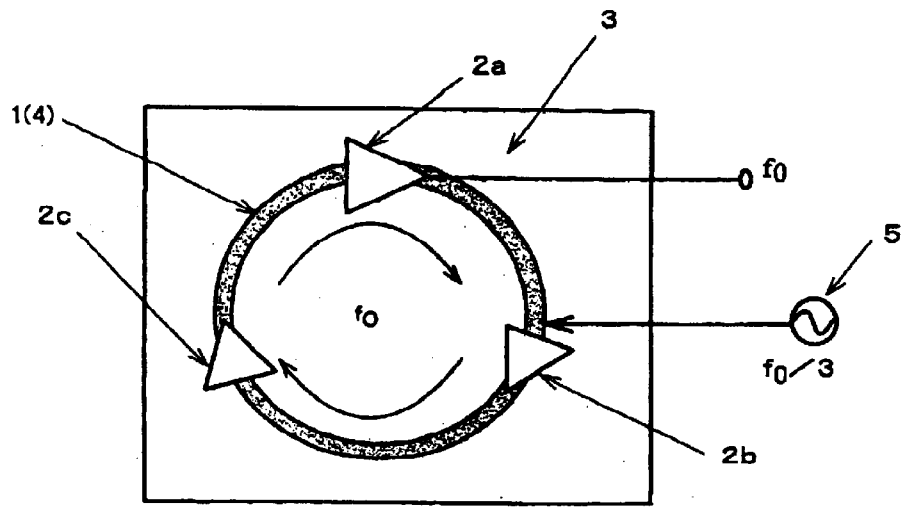
FIG. 1 is a schematic plan view illustrating the conventional high-frequency oscillator.
Figure 2A:
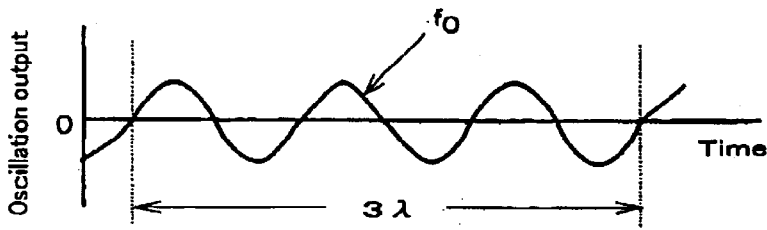
FIGS. 2A and 2B are frequency waveform charts illustrating the operation of the conventional high-frequency oscillator.
Figure 2B:
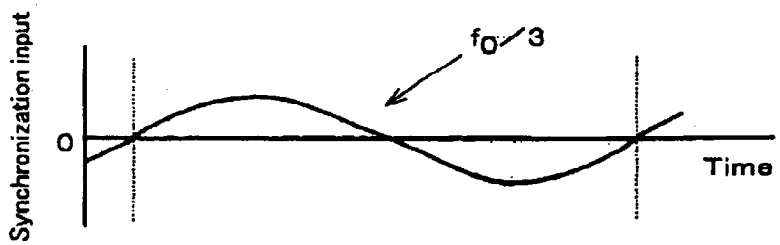
Figure 3A:
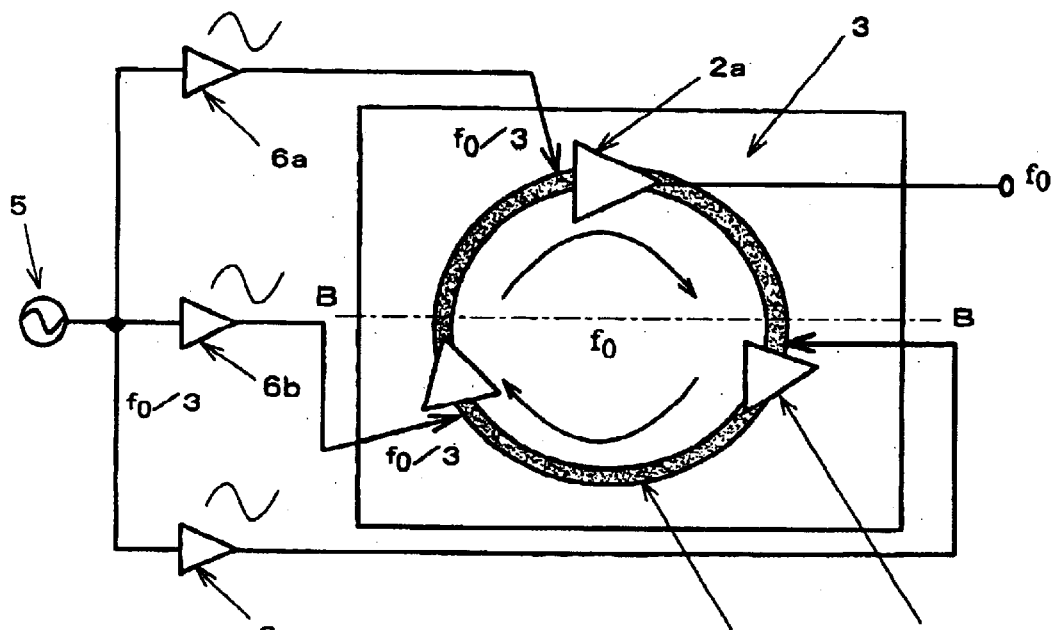
FIG. 3A is a schematic plan view illustrating an injection-locked high-frequency oscillator according to a first embodiment of the present invention.
Figure 3B:
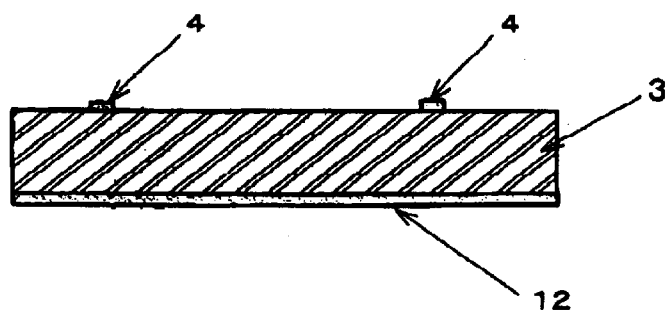
FIG. 3B is a cross-sectional view taken along the line B—B of FIG. 3A.

Similarly to the high-frequency oscillator illustrated in FIG. 1, the injection-locked high-frequency oscillator of the first embodiment, as illustrated in FIGS. 3A and 3B is provided with transmission line 1 for high frequency, which is constituted by a microstrip line, and a plurality of oscillating amplifiers 2a to 2c disposed in transmission line 1. In FIGS. 3A and 3B, the same or like constituting elements as those illustrated in FIG. 1 are provided with the same reference characters.

Transmission line 1 is constituted by signal line 4 annularly arranged in one of the principal planes of substrate 3 which is made of, for example, a dielectric material, and grounded conductor 12 arranged in substantially whole face of the other principal plane of substrate 3. Transmission line 1 and oscillating amplifiers 2a to 2c constitutes an oscillation closed loop. In this high-frequency oscillator, its oscillating frequency $f_0$ is basically determined by the electric length of transmission line 1, containing the delay time of oscillating amplifiers 2a to 2c.

In the illustrated embodiment, the number of units of oscillating amplifiers is 3, that is to say, m=3 is established. Each of oscillating amplifiers 2a to 2c has an identical delay time. Further, in one of the principal planes of substrate 3, oscillating amplifiers 2a to 2c are disposed in transmission line 1 so that respective lengths of line between oscillating amplifiers 2a to 2c in transmission line 1 are equal to one another, and so that input terminals are directed in the same direction as annular signal line 4. In conclusion, oscillating amplifiers 2a to 2c are geometrically equally disposed at a mutual interval of 120 degrees viewed from the center of a circle constituted by transmission line 1. Here, the electric lengths of line between the respective neighboring oscillating amplifiers containing the delay time of the oscillating amplifier are set so as to be a length corresponding to wavelength $\lambda$ of the oscillating frequency $f_0$, respectively. As a result, the total length of line of the oscillation closed loop becomes $3\lambda$.

An injection point of synchronizing signal is provided for each of oscillating amplifiers 2a to 2c at a position in transmission line 1 where an input terminal of the amplifier is disposed. The synchronizing signal supplied from signal source 5 such as a quartz-crystal oscillator is injected or supplied into these three injection points, via three power distribution units 6a to 6c. The phase of synchronizing signal from each of power distribution units 6a to 6c is brought into in-phase at the respective injection points. The frequency $f_s$ of the synchronizing signal is similar to the case of the conventional high-frequency oscillator and is set to be ⅓ of the oscillating frequency $f_0$. In conclusion, in the present constitution of the oscillator, the synchronizing signal under the condition that the multiplication number $\alpha$ is 3 is injected into common phase points between the respective neighboring oscillating amplifiers in the oscillation closed loop constituted by transmission line 1 and oscillating amplifiers 2a to 2c. The multiplication number $\alpha$ is identical with the number of units of the oscillating amplifiers.

Figure 4A:
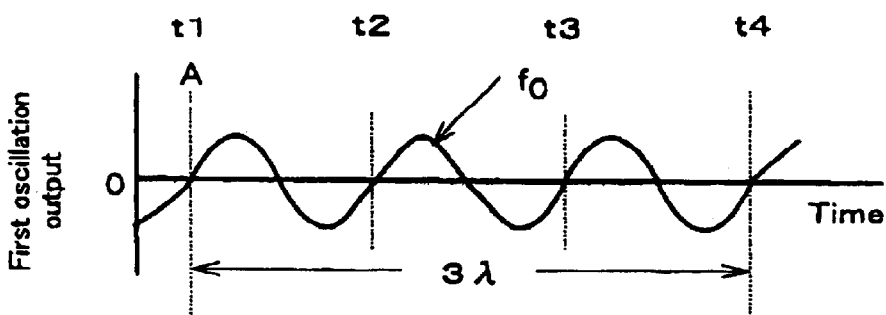
FIGS. 4A to 4D are frequency waveform charts illustrating the operation of the high-frequency oscillator illustrated in FIGS. 3A and 3B.
Figure 4B:
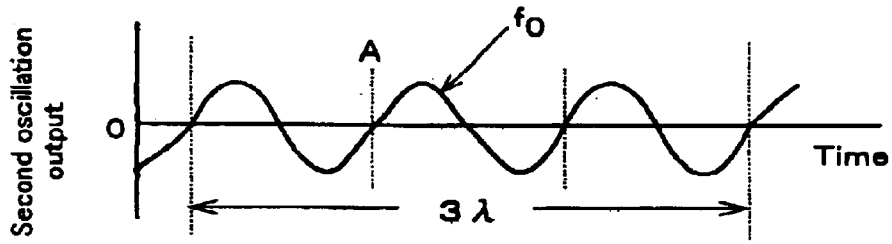
Figure 4C:
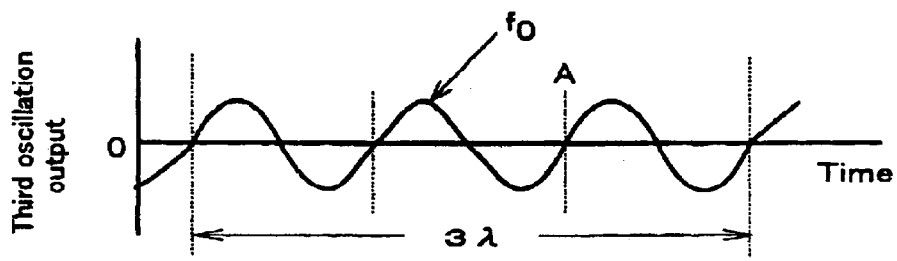
Figure 4D:
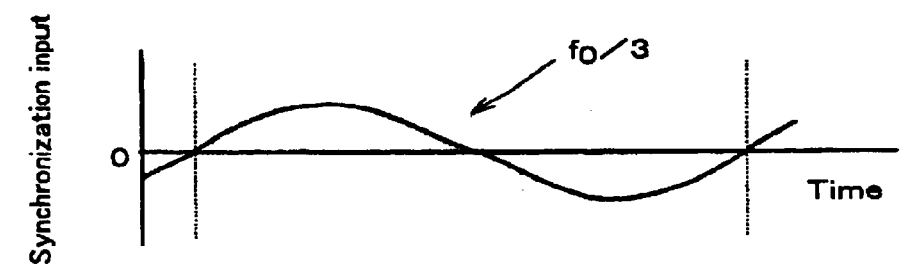

FIGS. 4A to 4C are waveform charts indicating the oscillation outputs of first to third oscillating amplifiers 2a to 2c, respectively, and FIG. 4D is a waveform chart of the synchronizing signal injected into the common phase points. Due to the injection of the synchronizing signal indicated in FIG. 4D into the in-phase input terminals of respective oscillating amplifiers, the oscillation outputs from oscillating amplifiers 2a to 2c are, as described in FIGS. 4A to 4C, equalized in their phases at the timings of every three times of the wavelength of the oscillating frequency.

Now, by taking transmission of the high frequency according to advancement of time into consideration, for example, when first oscillating amplifier 2a conducts outputting in synchronization with time t1, point "A" in the high-frequency signal output at time t1 will reach second and third oscillating amplifiers 2b and 2c at times t2 and t3, respectively. Further, since the outputs of second and third oscillating amplifiers 2b and 2c are synchronized with the synchronizing signal at time t1, their each are brought into synchronization at every 3λ. In conclusion, the high frequency transmitting through transmission line 1 is subjected to injection locking at every λ so that the phases thereof are equalized. From this fact, according to this high-frequency oscillator, highly stabilized oscillating frequency can be supplied. Oscillating output $f_0$ of this injection-locked high-frequency oscillator might be derived from the output terminal of, for example, first oscillating amplifier 2a.

Next, a description of an injection-locked high-frequency oscillator according to the second embodiment of the present invention will be provided below with reference to FIG. 5.

In the above-described first embodiment, although respective in-phase synchronizing signals are supplied into each of the common phase points from signal source 5 such as the crystal oscillator via power distribution units 6a to 6c, in this second embodiment, further anti-phase or negative phase synchronizing signals are supplied into anti-phase points located at respective intermediate positions between respective neighboring in-phase points.

That is to say, in the high-frequency oscillator according to the second embodiment, power distribution units 6a to 6c and 7a to 7c respectively having three phase-equalized in-phase outputs and anti-phase outputs, are connected to signal source 5. The in-phase synchronizing signals from power distribution units 6a to 6c are, as described before, supplied into in-phase points arranged on the side of respective input terminals of oscillating amplifiers 2a to 2c. On the other hand, the anti-phase synchronizing signals from power distribution units 7a to 7c, which are reversal signals of the in-phase synchronizing signals, are supplied into anti-phase points. The anti-phase point is a point where the waveform of the oscillating frequency is shifted 180 degrees in its phase relative to the in-phase point, and thus when the input terminal of the oscillating amplifier corresponds to the in-phase point, the anti-phase point corresponds to an electric intermediate point in the transmission line running between the neighboring oscillating amplifiers.

Figure 5:
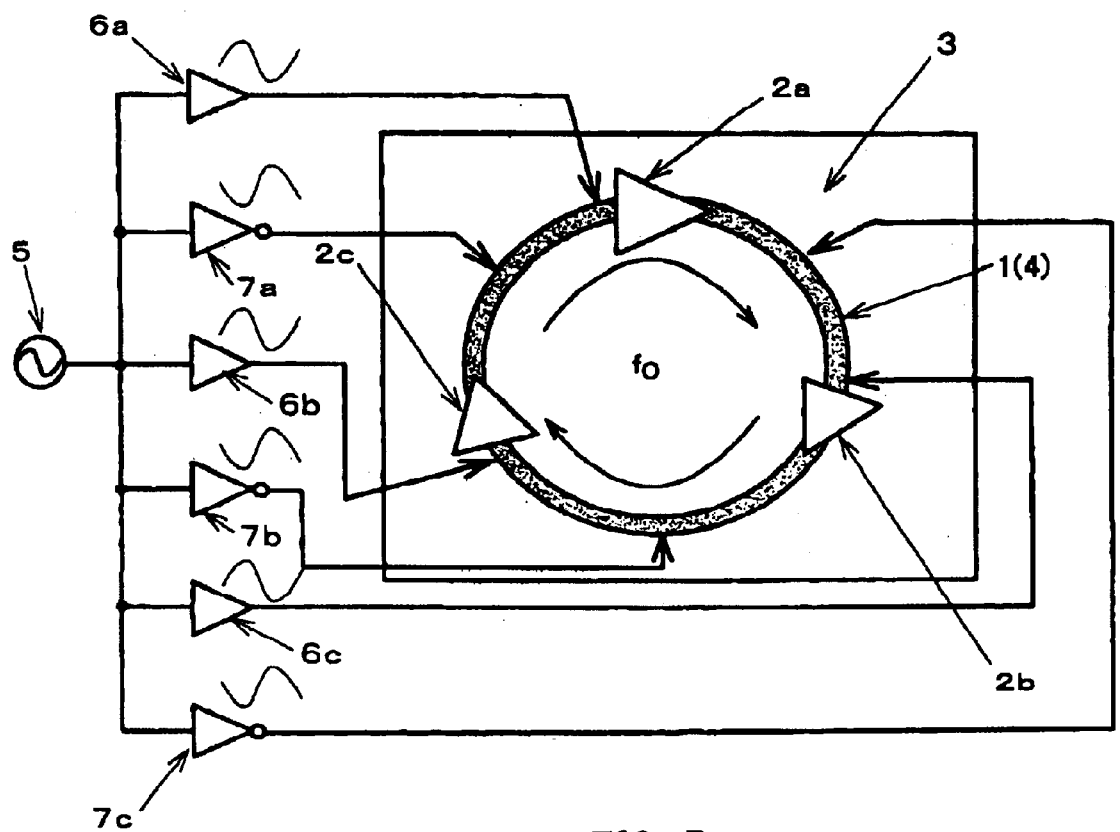
FIG. 5 is a schematic plan view illustrating an injection-locked high-frequency oscillator according to a second embodiment of the present invention.

As described above, with the high-frequency oscillator illustrated in FIG. 5, not only into the input terminal sides of respective oscillating amplifiers 2a to 2c that are the in-phase points but also into their electric intermediate points that are the anti-phase points, the synchronizing signals are injected. Specifically, since the anti-phase synchronizing signals are injected into the anti-phase points, if the in-phase points are points that correspond to wavelength λ, synchronizing can be achieved at point of λ/2 with regard to the resonant frequency component. When attention is turned to only the anti-phase points, shifting by an amount of wavelength λ occurs at three respective anti-phase points so as to be synchronized at every 3λ. When synchronizing at in-phase points and that in anti-phase points are totalized, synchronizing occurs at every λ/2 along transmission line 1, and therefore, in comparison with the first embodiment, the oscillator of this embodiment can further stabilize the oscillating frequency.

A description of an injection-locked high-frequency oscillator according to the third embodiment of the present invention will be provided below, with reference to FIGS. 6A and 6B.

Figure 6A:
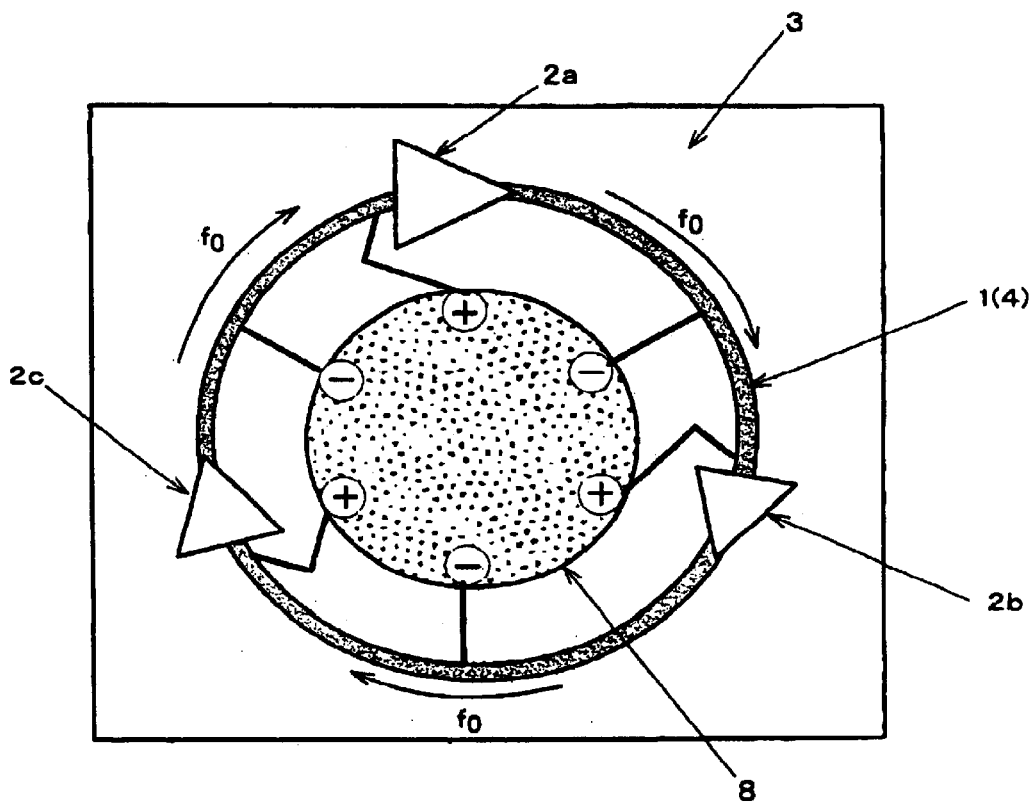
FIGS. 6A and 6B are schematic plan and cross-sectional views illustrating an injection-locked high-frequency oscillator according to a third embodiment of the present invention, respectively.
Figure 6B:
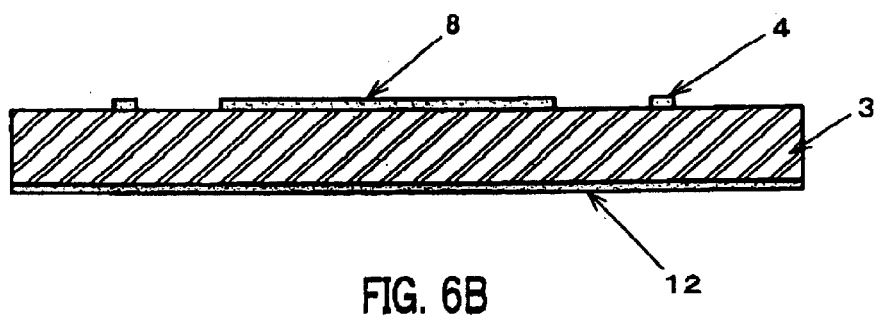

In the above-described respective embodiments, although the synchronizing signals from the external signal source are injected into the oscillation closed loop via the power distribution units, in the oscillator illustrated in FIGS. 6A and 6B, no external signal source is used, and a planar resonator consisting of planar circuits is instead used. Synchronizing signals are injected into a transmission line by mutual cooperation of the planar resonator and the transmission line.

The constitution illustrated in FIGS. 6A and 6B is, similarly to those described before, provided with a high-frequency oscillator which are constituted by transmission line 1 of microstrip line construction having annular signal line 4, and first to third oscillating amplifiers 2a to 2c disposed in this transmission line 1, and a planar resonator combined with this high-frequency oscillator. The planar resonator is provided inside annular transmission line 1, and has a microstrip line construction, which is constituted by disc-like conductor 8 arranged in one principal plane of substrate 3 and grounded conductor 12 arranged in the other principal plane of substrate 3. Thus, the planar resonator can be a so-called ring resonator.

In this embodiment, $TM_{31}$ mode that is a higher mode of resonation is adapted for the planar resonator. The $TM_{31}$ mode has positive electric potential points (+) spaced 120 degrees apart from one another and negative electric potential points (−) located at the intermediate thereof, and is a resonant mode, which is generated by respective electric fields between three pairs of positive and negative electric potential points in conductor 8 and grounded conductor 12, and magnetic fields associated with the electric fields. The $TM_{31}$ mode creates first to third resonance portions.

The resonant frequencies of respective resonance portions due to the respective pairs of the positive and negative electric potential points become mutually identical with one another, and are set at $f_0/3$ of the oscillating frequency $f_0$ of this high-frequency oscillator. Further, to the input sides of first to third oscillating amplifiers 2a to 2c, respective positive electric potential points creating the first to third resonance portions are connected by lines. Similarly, to the respective electric intermediate points between respective neighboring oscillating amplifiers, respective negative electric potential points are connected by lines.

In the high-frequency oscillator of the described constitution, as described before, the oscillating frequency $f_0$ is determined by the electric length of transmission line 1 containing delay times of oscillating amplifiers 2a to 2c, since the positive electric potential points of the first to third resonance portions of the planar resonator of which the resonant frequency is $f_0/3$, are respectively connected to the in-phase points provided on the input sides of the first to third oscillating amplifiers 2a to 2c, respective oscillating amplifiers 2a to 2c are, similarly to the afore-described embodiments, resonated at every 3λ to be synchronized. Namely, a specific effect identical with the injection of the synchronizing signals to become $f_0/3$ is exerted. As described in connection with the first embodiment, since the waveform of the high frequency transmits through transmission line 1 constituted by the microstrip line in response to the time lapse, respective oscillating amplifiers 2a to 2c are synchronized with the resonant frequency, respectively, while being shifted in their phase by an every amount of λ. Therefore, the high frequency is subjected to injection locking at every λ during the circulation thereof around transmission line 1, so that the phases thereof are equalized.

Further, since the negative electric potential points of respective first to third resonance portions are connected to the anti-phase points arranged between the neighboring oscillating amplifiers, the high frequency is synchronized with the resonant frequency at every λ/2, and accordingly, similarly to the second embodiment, the oscillating frequency is further stabilized.

Although the description of the preferred embodiments of the present invention was provided hereinbefore, it should be noted that the present invention is not limited to the described embodiments.

In the above-described respective embodiments, the number of units of oscillating amplifiers is chosen as "m", the length of each line between respective neighboring oscillating amplifiers is chosen as "λ", and the number of multiplication α of the synchronizing signals to the oscillating frequency $f_0$ is chosen as "3", so that the synchronizing signals having the frequency of $f_0/3$ are injected into three in-phase points, to thereby execute synchronizing at every one wavelength of the oscillating frequency $f_0$. However, the present invention is not limited to this, and the number of multiplication α of the synchronizing signals may be chosen as "n" times ("n" is a natural number) of the number of units "m" of the oscillating amplifiers. Namely, the "m" numbers of waves of the oscillating frequency $f_0$ are permitted to pass through specified points in the oscillation closed loop against one wavelength of the synchronizing signals, and "m" and "n" are chosen to be mathematically relatively prime to one another. Then, injection may be conducted at "n" numbers of in-phase points in transmission line 1, which are equidistantly spaced from one another, in order that the oscillating amplifiers are resultantly synchronized with the synchronizing signals at every nλ.

Further, although the electric length of each transmission line between the respective neighboring oscillating amplifiers containing the delay in the respective oscillating amplifiers is chosen as one wavelength (λ) of the oscillating frequency $f_0$, the choice should not be limited to this, and the injection of the synchronizing signals may be exerted with the length of line chosen as nλ, so that synchronizing is effected at every nλ, similarly to the afore-description.

In these cases, a plurality of in-phase points appear in the transmission lines between respective neighboring oscillating amplifiers, and accordingly it may be possible to inject the synchronizing signals into such plurality of in-phase points.

In the foregoing description, transmission line 1 has the microstrip line structure, and also the planar resonator employed is formed in the microstrip line structure having disc-like conductor 8. However, the planar resonator may consist of one having, for example, the shape of a doughnut, which can induce a higher-order wave mode $T_{n1}$. Further, as illustrated in FIGS. 7A and 7B, a transmission line having a coplanar line structure but no microstrip line structure may be employed.

Figure 7A:
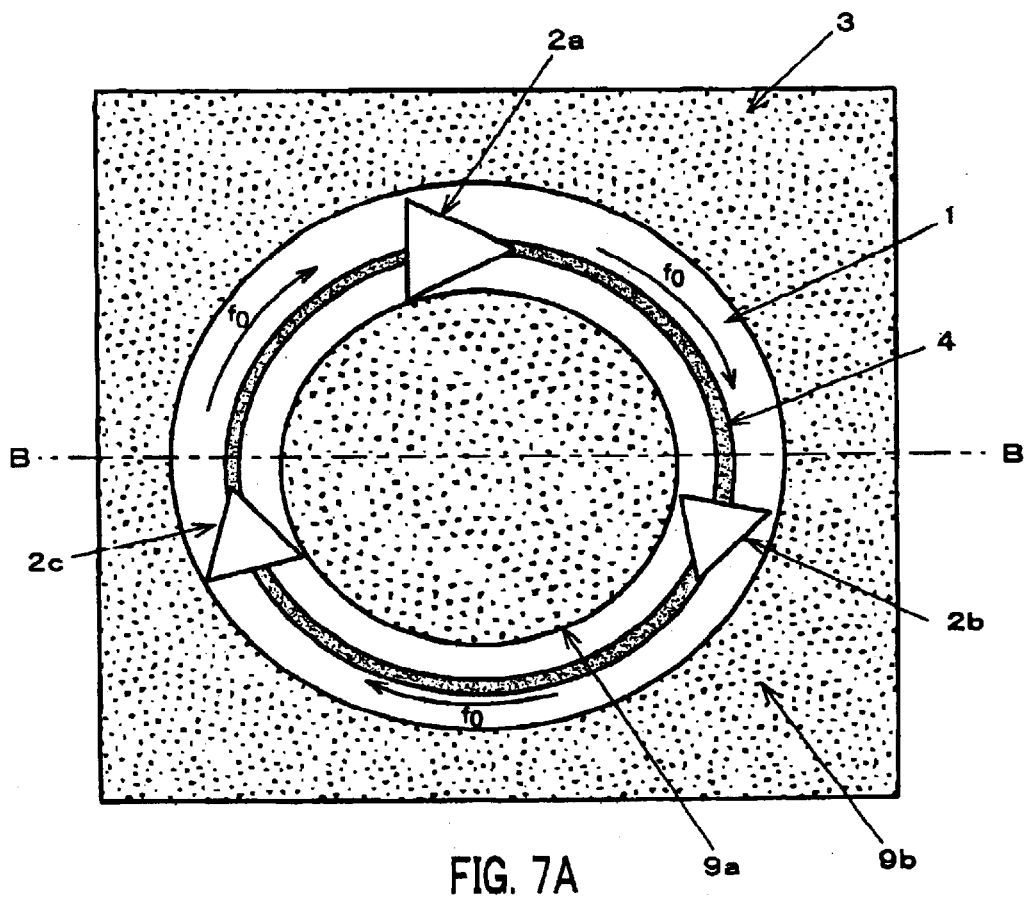
FIG. 7A is a schematic plan view illustrating an injection-locked high-frequency oscillator according to another embodiment of the present invention; and, FIG. 7B is a cross-sectional view taken along the line B—B of FIG. 7A.
Figure 7B:
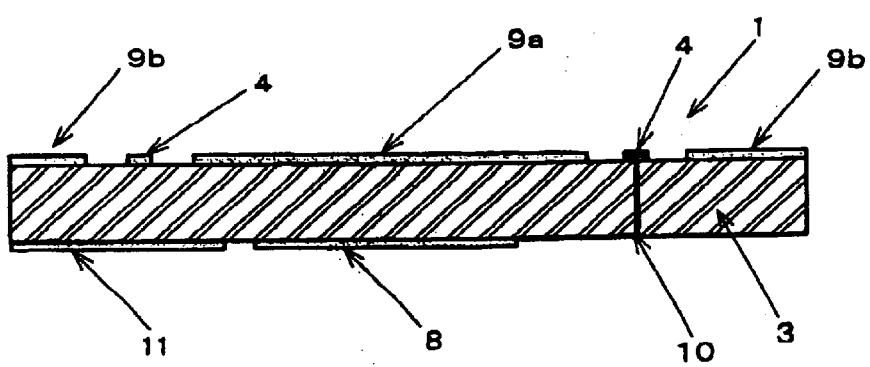

In the embodiment illustrated in FIGS. 7A and 7B, grounded conductor 9b is provided on one principal plane of substrate 3, and grounded conductor 9b is formed with a circular opening in which annular signal line 4 and disc-like grounded conductor 9a surrounded by annular signal line 4 are disposed. In the one principal plane of substrate 3, grounded conductor 9a, the annulus formed by signal line 4 and the opening of grounded conductor 9b are arranged to be concentric with one another, and these elements form transmission line 1 in the shape of doughnut-like coplanar line structure.

Through transmission line 1, a high frequency is permitted to transmit by an electric field, which is generated between signal line 4 and inner and outer-grounded conductors 9a and 9b, and a magnetic field generated by the electric field. In transmission line 1, oscillating amplifiers 2a to 2c are equidistantly arranged in the manner similar to the afore-described embodiments, and by these transmission line 1 and oscillating amplifiers 2a to 2c, a high-frequency oscillator is constituted.

In the other principal plane of substrate 3, disc-like conductor 8 opposing grounded conductor 9a is provided to form a planar resonator. The radius of disc-like conductor 8 is made smaller than that of grounded conductor 9a. This disc-like conductor 8 is connected to signal line 4 provided on the one principal plane by via holes 10 (provided, for example, at three positions) in order to inject a signal of frequency that is one third of the oscillating frequency $f_0$. Hereby, respective oscillating amplifiers 2a to 2c are synchronized with the injection signals from the planar resonator, i.e., disc-like conductor 8. The output of this high-frequency oscillator can be derived from output line 11, which is arranged on the other principal plane of substrate 3, having a microstrip line construction, and loosely coupled with disc-like conductor 8.

In the foregoing description, although the high-frequency oscillator has an arrangement in which oscillating amplifiers are disposed inside the transmission line, the present invention is not limited to such arrangement. For example, in the case where a plurality of amplifying elements or the like constituted by FETs (field effect transistors) having a delay-control function, respectively, are connected to one another to thereby form an oscillation closed loop, if injection of synchronizing signals into in-phase points of the oscillation closed loop is conducted, it will be possible to adapt the present invention. In such case, the synchronizing signals should preferably be injected into points, which equally divide the electric length of line of the oscillation closed loop containing the respective amplifying elements.

The points of injection of the synchronizing signals are not limited to the input sides of respective oscillating amplifiers. The in-phase points in respective transmission lines extending between respective oscillating amplifiers, appropriate nodes in a transistor circuit which are selected by taking interference and impedance matching into consideration, or the sub gate electrode of a dual gate FET might be employed as an in-phase point. In conclusion, the synchronizing signals should preferably be injected into in-phase points in the transmission lines extending between respective amplifying elements containing the amplifying elements.

The substrate is not limited to a dielectric substrate, and either a substrate made of a magnetic material or a semiconductor substrate be used for the substrate used in the present invention. Further, by the use of these substrates, a plurality of substrates each having thereon various planar circuits may be laminated to constitute a multilayered microwave integrated circuit. Then, a multifunctional high-frequency oscillator may be formed and provided using the multilayered microwave integrated circuit. Furthermore, on a semiconductor substrate having the surface thereof in which circuit elements such as semiconductor elements including integrated circuits and functional circuits, and passive elements are formed, the afore-mentioned respective planar circuits might be mounted and connected together by, for example, via holes, to thereby constitute a so-called three dimensional MMIC (monolithic microwave integrated circuit). Such constitution of MMIC can achieve great miniaturizing of the high-frequency oscillator.

Although either injection of in-phase synchronizing signals into in-phase points in the oscillation closed loop or injection of anti-phase synchronizing signals into anti-phase points in the oscillation closed loop is conducted in the foregoing embodiments, a further case where injection of synchronizing signals is conducted into respective points in respective transmission lines extending between the oscillating amplifiers of the oscillation closed loop while controlling the phases of the synchronizing signals injected to these points to thereby permit any points in the respective transmission lines to be chosen as injection points will enable it to execute a control in response to the wavelength of the resonant frequency $f_0$. For example, in the case where three oscillating amplifiers are employed, and the electric length of respective transmission lines extending between respective two neighboring oscillating amplifiers is set to correspond to one wavelength of the oscillating frequency, if an injection point in a first transmission line portion between first and second oscillating amplifiers, and that in a second transmission line portion between second and third oscillating amplifiers are shifted by an amount of θ degrees, shifting of respective synchronizing signals by an amount of θ degrees will result in occurrence of synchronizing in both transmission line portions while being shifted by an amount of one wavelength, respectively. Thus, synchronization with every one wavelength will be acquired.

Further, in the described embodiments, although the length of the transmission line between the two neighboring oscillating amplifiers is a multiplication of an integer of the wavelength λ of the oscillating frequency, if one circle of the oscillation closed loop is, for example, chosen as a multiplication of an integer of the wavelength of the oscillating frequency, and if the length of line of the transmission line between the two neighboring oscillating amplifiers is chosen as a multiplication of an odd number of λ/2, the present invention may be applied. Namely, for example, if the number of units of oscillating amplifiers is 4, and if the length of line between the two neighboring oscillating amplifiers is set as 0.5λ, the entire line length of the whole oscillation closed loop becomes 2λ, which causes a positive feedback. In a further case, with one set of opposed transmission line portion, in-phase synchronizing signals may be injected into points that are regarded as in-phase points, and with the other set of transmission line portion, synchronizing signals whose phase is reverse to the signals injected into the in-phase points may be injected into points that are regarded as anti-phase points. In this case, the synchronization will be well conducted at every λ/2.

It should be understood that various changes and modifications of the present invention including those other than the afore-described embodiments are possible without departing from the scope and spirit thereof. Namely, any concept in which synchronizing signals are injected into in-phase points either located between oscillating amplifiers or in amplifying elements, so that the phase of the oscillating frequency is controlled by the use of phase shifting due to transmission of a high frequency will fall within the technical scope of the present invention.

What is claimed is:

1. An injection-locked high-frequency oscillator in which an oscillating frequency thereof is determined by an electric line length of an oscillation closed loop, said high-frequency oscillator comprising:

an annular transmission line;

m units of oscillating amplifiers disposed in said transmission line, m being defined as an integer larger than 1; and means for injecting synchronizing signals each having a frequency of 1/mn of said oscillating frequency into in-phase points in said oscillating closed loop, n being defined as a natural number;

wherein said transmission line and said oscillating amplifiers form said oscillation closed loop; and wherein when a wavelength corresponding to said oscillating frequency is defined as λ, an electric line length from any one of said oscillating amplifiers to a neighboring oscillating amplifier is set as nλ by taking into consideration a delay time due to said oscillating amplifiers.

2. The high-frequency oscillator according to claim 1, wherein reverse signals to said synchronizing signals are injected to anti-phase points which are intermediate of said in-phase points.

3. The high-frequency oscillator according to claim 1, wherein said synchronizing signals injected into said plural in-phase points are made to be in identical phase, respectively.

4. The high-frequency oscillator according to claim 2, wherein said synchronizing signals injected into said plural in-phase points are made to be mutually identical in their phases, and wherein said reverse signals injected into said anti-phase points are made to be mutually identical in their phases.

5. The high-frequency oscillator according to claim 1, wherein said in-phase points are disposed at mutually geometrically equal positions in said oscillation closed loop.

6. The high-frequency oscillator according to claim 2, wherein said plural in-phase points are disposed at mutually geometrically equal positions in said oscillating closed loop, and wherein said anti-phase points are disposed at mutually geometrically equal positions in said oscillating closed loop.

7. The high-frequency oscillator according to claim 1, wherein said injecting means comprises an oscillating signal source for generating said synchronizing signals.

8. The high-frequency oscillator according to claim 1, wherein said transmission line comprises a microstrip line structure.

9. The high-frequency oscillator according to claim 8, wherein m=3 and n=1.

10. The high-frequency oscillator according to claim 1, wherein said transmission line comprises a coplanar line structure.

11. The high-frequency oscillator according to claim 10, wherein m=3 and n=1.

12. The high-frequency oscillator according to claim 1, wherein said injecting means comprises a high-order mode planar resonator having a plurality of resonating portions generating between a plurality of paired positive and negative electric potential points, the positive electric potential point being connected to said in-phase points in said transmission line.

13. The high-frequency oscillator according to claim 2, wherein said injecting means comprises a high-order mode planar resonator having a plurality of resonating portions generating between a plurality of paired positive and negative electric potential points, the positive electric potential point being connected to said in-phase points in said transmission line.

14. The high-frequency oscillator according to claim 13, wherein said negative electric potential point is connected to said anti-phase points.

15. The high-frequency oscillator according to claim 12, wherein said planar resonator comprises a microstrip line or a coplanar line, and has a resonant mode of a high-order mode.

16. The high-frequency oscillator according to claim 14, wherein said planar resonator comprises a microstrip line or a coplanar line, and has a resonant mode of a high-order mode.

* * * * *